(12) United States Patent
Pulskamp et al.

(10) Patent No.: US 7,876,026 B2
(45) Date of Patent: Jan. 25, 2011

(54) LARGE FORCE AND DISPLACEMENT PIEZOELECTRIC MEMS LATERAL ACTUATION

(75) Inventors: Jeffrey Spencer Pulskamp, Mclean, VA (US); Ronald G. Polcawich, Derwood, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 216 days.

(21) Appl. No.: 12/195,571

(22) Filed: Aug. 21, 2008

(65) Prior Publication Data

US 2010/0045141 A1 Feb. 25, 2010

(51) Int. Cl.
*H01L 41/04* (2006.01)
(52) U.S. Cl. .................. 310/328; 310/330; 310/333
(58) Field of Classification Search .................. 310/312, 310/324, 328, 330–333, 365, 366
See application file for complete search history.

(56) References Cited

U.S. PATENT DOCUMENTS

2008/0061916 A1* 3/2008 Pulskamp .................. 336/130

* cited by examiner

*Primary Examiner*—Derek J Rosenau
(74) *Attorney, Agent, or Firm*—Avrom David Spevack; Alan I. Kalb

(57) ABSTRACT

A piezoelectric microelectromechanical systems (MEMS) actuator includes a silicon substrate; an actuator beam comprising a first end region connected to the silicon substrate and a second end region connected to a mechanically compliant spring assembly; a first electrode over the silicon substrate; a piezoelectric layer above the first electrode; a second electrode over the piezoelectric layer; a conductive top structural layer above the second electrode, wherein a center half of the actuator beam is configured as a positive deflection region, and wherein both the first electrode and the second electrode supply voltage to both positive and negative deflection regions of the actuator beam.

9 Claims, 13 Drawing Sheets

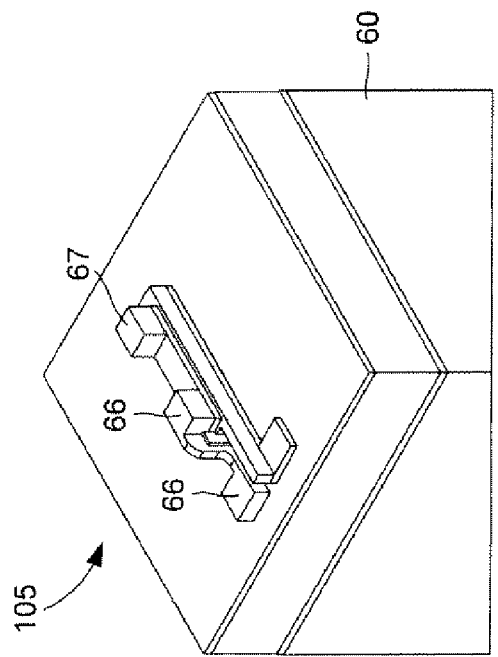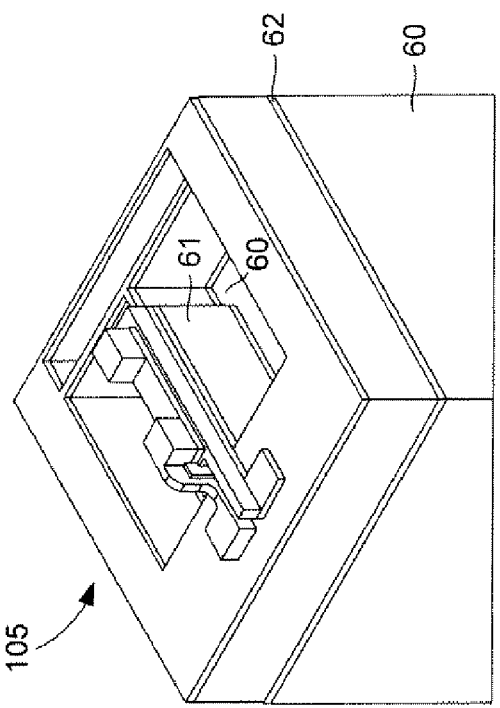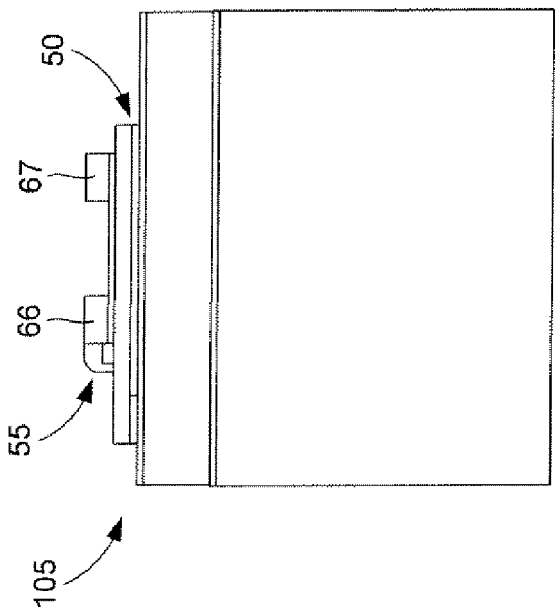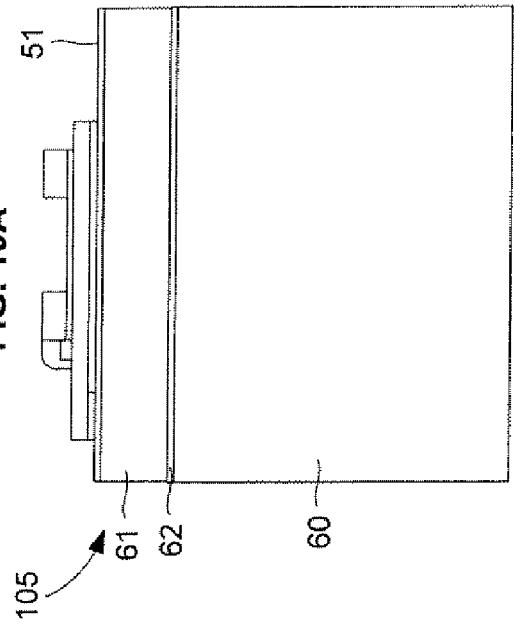

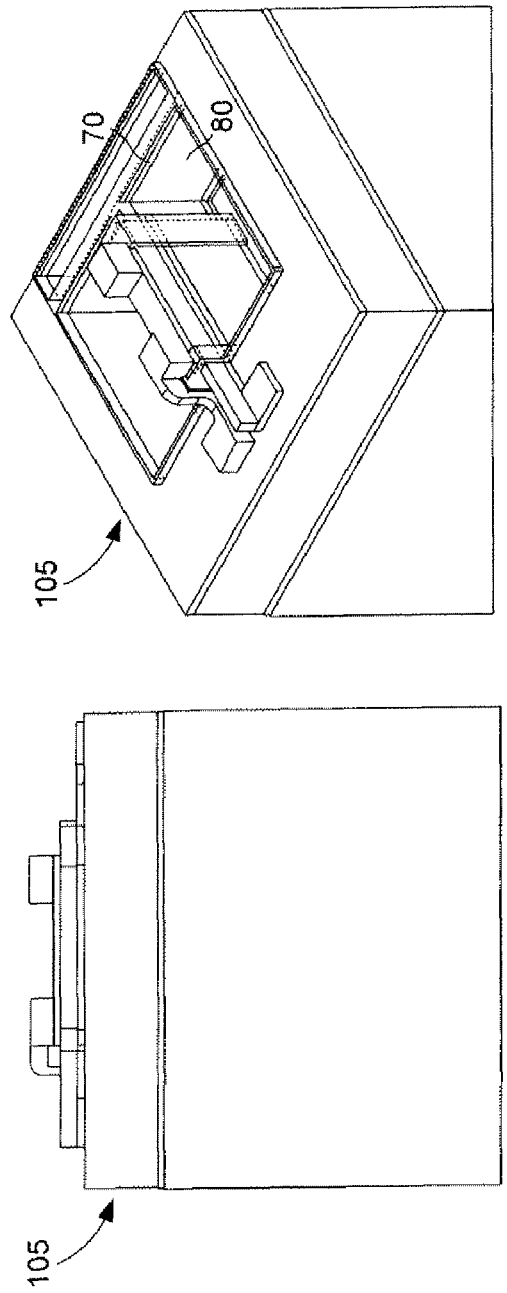
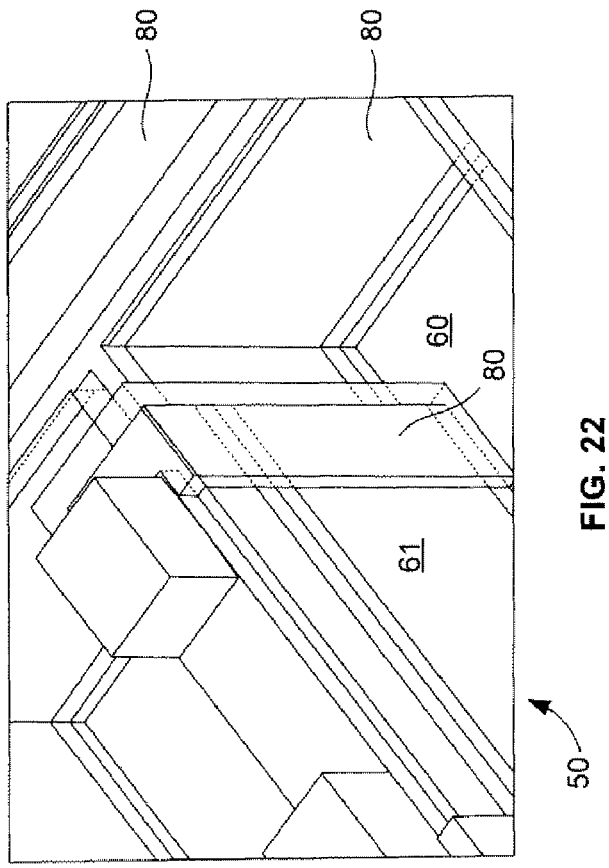

LARGE FORCE AND DISPLACEMENT PIEZOELECTRIC MEMS LATERAL ACTUATION

GOVERNMENT INTEREST

The embodiments described herein may be manufactured, used, and/or licensed by or for the United States Government without the payment of royalties thereon.

BACKGROUND

1. Technical Field

The embodiments herein generally relate to microelectromechanical systems (MEMS), and, more particularly, to piezoelectric MEMS actuators.

2. Description of the Related Art

MEMS piezoelectric actuators are the basic building blocks for complex electromechanical systems such as radio frequency (RF) MEMS, optical switching, robotics, and many more applications. Generally, piezoelectric MEMS actuators significantly outperform the present standard—electrostatic MEMS actuators, at significantly smaller sizes, power consumption, actuation voltages, and displacement ranges. Moreover, piezoelectric MEMS devices typically permit extremely large displacements; approximately hundreds to thousands of microns, at very low voltages.

Conventional piezoelectric MEMS actuators are positive vertical unimorph actuators 1 as depicted in FIGS. 1A through 2. This MEMS technology, an adaptation of a decades old macro-scale design, has been around for over a decade. At the macro-scale, a large number of piezoelectric actuator designs have been developed and utilized. Many designs are based upon or are derivatives of the following basic technologies: unimorph and bimorph benders, stack actuators, externally frequency leveraged actuators like the Inchworm actuators, and externally kinematically leveraged actuators like the "Cymbal" & "Moonie" flextensional actuator designs. These macro-scale actuators can typically be utilized in an arbitrary orientation depending largely on the application. However, integrated MEMS devices do not share this characteristic and often the degree of freedom of the actuator has a dramatic impact on its design. For example, the dominant MEMS transduction technology, electrostatic MEMS, utilizes two very different designs for out-of-plane and in-plane actuation. Interdigitated "comb drive" actuators provide excellent capability for in-plane operation while "parallel plate" designs are typically employed for out-of-plane operation. The differences in these designs are dramatic. Only recently have attempts been made to design in-plane or lateral deflecting piezoelectric MEMS actuators.

A conventional piezoelectric unimorph actuator 1 is depicted in FIGS. 1A and 1B. The actuator 1 bends due to a voltage applied across the electrodes 2, 3, the piezoelectric effect, and a particular mechanical asymmetry of the structure of the actuator 1 relative to the structure's piezoelectric layer 4. The piezoelectric unimorph actuator 1 bends due to a piezoelectrically induced bending moment acting about the neutral plane (or planes). Fundamentally, there are two parameters that dictate the direction of motion of a piezoelectric cantilevered unimorph actuator 1, the sense of the strain within the piezoelectric layer 4 (sense of piezoelectric equivalent force component of the bending moment) and the relative position of the geometric mid-plane of the piezoelectric layer 4 with respect to the neutral plane or axis of the actuator 1 (sense of the moment arm of the bending moment). For out of plane (x-y) actuators, the relevant neutral plane is the x-y neutral plane. A structural dielectric layer 5 provides the necessary asymmetry for a non-zero moment. Moreover, a substrate (not shown) may be used to anchor one end of the actuator 1.

As illustrated in FIG. 2, for any three-dimensional object, there are three orthogonal neutral planes (axis); x-y, x-z, and y-z. The neutral plane (axis) is the location within the structure where there is equal contribution to structural stiffness (resistance to deformation) on either side of the plane (axis) and under pure bending, is the location of zero strain along the axis normal to this plane. If the strain field of the piezoelectric layer 4 is asymmetric about any of these neutral planes (axis), then it will contribute a component of a bending moment that acts upon the composite structure. For a vertical piezoelectric unimorph actuator 1, the piezoelectric strain field should be symmetric about the x-z and y-z neutral planes (axis). It is the x-y neutral plane (axis) that is relevant.

Piezoelectric materials deform (strain) when in the presence of an applied electric field. This behavior is due to the electric field induced atomic displacements within the crystalline unit cell of a piezoelectric material 4. These displacements cause the geometric distortion of the unit cell, and consequently, of the piezoelectric material 4 on the macroscopic scale as well. FIGS. 3A and 3B depict the ferroelectric unit cell of Lead-Zirconate-Titanate (PZT). FIG. 3A illustrates the high temperature non-piezoelectric form of PZT with a cubic unit cell. FIG. 3B depicts the low temperature piezoelectric form of PZT with a tetragonal unit cell. The central atom 12 of the tetragonal unit cell (either Ti or Zr) is displaced from the center of the unit cell. This vertical displacement represents the poled state of the material and is conditioned with an applied electric field. Multiple orientations or phases are possible for PZT; for simplicity, only the tetragonal phase is illustrated.

In FIGS. 3A and 3B, atoms 10 are Pb, atoms 11 are O, and the central atom 12 is either Zr or Ti; which is typically in a 52/48 compositional ratio. When an electric field is applied to the material that displaces the central atom 12 in the positive direction (arrow 13); the tetragonal unit cell is distorted further and a net elongation along the long axis 15 relative to the poled configuration occurs. When small electric fields are applied that displaces the central atom 12 in the negative direction; the tetragonal unit cell contracts along the long axis 15. Once the electric field exceeds the coercive filed of the material, the central atom 12 continues to displace in the downward direction (arrow 14) and the tetragonal unit cell experiences a net elongation again along the long axis 15.

FIGS. 4A and 4B illustrate the polarization/electric field plot of a ferroelectric material. This hysterisis loop illustrates the relationship between polarization within a ferroelectric material and the applied electric field. Point 16, 18 where the loop intersects the field axis is the value of the coercive field. The coercive field is the electric field value required to cancel the internal remnant polarization of the ferroelectric material. Point 17, 19 where the loop intersects the polarization axis is the value of the remnant polarization. The remnant polarization is the measure of residual polarization remaining in the ferroelectric once the applied field has been removed. For small values of an applied electric field, the central atom 12 (of FIG. 3B) displaces positively or negatively from its poled position, depending upon the polarity of the field. For the scenario illustrated in FIGS. 3A and 3B at small electric field values, a positive displacement of the central atom 12 creates a net elongation (long axis 15) of the unit cell while a negative displacement creates a net contraction (long axis) of the unit cell relative to the poled unit cell orientation. However, for applied electric field values that exceed the value necessary to displace the central atom 12 back to the unit cell mid-plane (i.e. the coercive field), the central atom 12 will continue to displace in the direction of the applied field. Once this occurs, the unit cell will no longer experience a net contraction along the c axis, relative to the poled orientation, and instead will experience a net elongation along the c axis. This is due to the mirror symmetry of the unit cell about its mid-plane. Thus for large electric fields applied to the piezoelectric material, only a single sense of the piezoelectric strain is possible and therefore is independent of applied field polarity. As can be seen in FIGS. 3A and 3B, the sense of piezoelectric strain at high field strengths is in-plane contraction and out of plane (long axis) elongation.

This high field condition is rarely encountered in bulk ferroelectric/piezoelectric materials because the material thicknesses are so large. The behavior of piezoelectrics at large fields is not commonly understood in the MEMS community. However, for MEMS ferroelectric/piezoelectric actuators, this condition is typically encountered at small voltages (2-3V). The in-plane contraction of the piezoelectric material at large fields gives a negative sense to the piezoelectric equivalent force. The standard composite stack (FIGS. 1A and 1B) gives a positive sense of the moment arm. At small fields, with the appropriate polarity, a standard piezoelectric MEMS actuator 1 (FIGS. 1A and 1B) will deflect downward. However, as the voltage increases to a value near the coercive field, the actuator 1 will switch directions and will then bend upward. As the field strength is increased further, the actuator 1 will continue to bend upward. If the opposite polarity voltage is applied, the actuator 1 will bend downward for small voltages less than the coercive field. Again, as the voltage reaches a value greater than the coercive field the actuator 1 bends upward. Therefore, the standard piezoelectric MEMS unimorph actuator 1 is typically unable to attain large negative (into the plane) deflections.

Only recently have attempts been made to design in-plane or lateral deflecting piezoelectric MEMS actuators, "recurve" actuator technology developed by Ervin and Brei (Ervin, et al., "Recurve Piezoelectric-Strain-Amplifying Actuator Architecture", IEEE/ASME Transactions on Mechatronics, Vol. 3, 293-301 (1998), the complete disclosure of which, in its entirety, is herein incorporated by reference) This actuator design can achieve large displacements but is limited to small force generation per unit area. J. Cheong developed MEMS flextensional actuators based on a buckled beam design; however this approach is severely limited to very small deflections (Cheong, J., "Design, fabrication, modeling, and experimental testing of a piezoelectric flextensional microactuator," Ph.D. thesis, Department of Mechanical and Nuclear Engineering, Penn State University, 2005, the complete disclosure of which, in its entirety, is herein incorporated by reference). N. Conway and Kim have developed true in-plane piezoelectric MEMS actuators using a stroke amplification scheme. (Conway et al., "Large-Strain, Piezoelectric, In-Plane Micro-Actuator," IEEE MEMS 2004, the complete disclosure of which, in its entirety, is herein incorporated by reference). This design is intended to be flextensional, utilizing the in-plane strain of the piezoelectric material and a kinematic mechanism to provide limited amplification of this naturally small deflection. The design features a full top electrode and is intended to suppress bending action of the device altogether. These existing lateral piezoelectric MEMS actuators have utilized undesirable methods for increasing piezoelectric actuator stroke length, either in terms of lost work efficiency, or in chip area required to leverage the basic actuation stroke and are generally subject to variation in performance due to residual stress deformation.

There are a number of applications for lateral piezoelectric MEMS actuators, including RF MEMS and millimeter-scale robotics that require greater deflection, force, and work per unit area than the current state of the art can provide. RF MEMS devices can benefit from greater contact forces and free displacements from lateral piezoelectric MEMS actuators and greater deflection, force, and work per unit area per unit power actuators can enable millimeter-scale robotics. Therefore, there exists a need for lateral deflecting piezoelectric MEMS actuators with improved deflection, force, and work per unit area performance.

SUMMARY

In view of the foregoing, an embodiment herein provides a piezoelectric MEMS actuator that produces piezoelectric actuation bending moments to generate lateral actuator displacements, the actuator comprising an actuator beam comprising oppositely positioned distal ends; a silicon substrate having a first thickness and attached to one of the distal ends; a dielectric layer having a second thickness less than the first thickness and positioned above the silicon substrate; a first electrode having a third thickness less than the first thickness and positioned above the dielectric layer; a piezoelectric layer having a fourth thickness greater than the second and third thicknesses and positioned above the first electrode; a second electrode having a fifth thickness substantially equal to or less than the third thickness and positioned above the piezoelectric layer; and a conductive structural layer having a sixth thickness greater than the third thickness and positioned above the second electrode, wherein a central region of the actuator beam produces a first piezoelectric actuation bending moment in a first direction, wherein the distal ends produce a second piezoelectric actuation bending moment equal to the first piezoelectric bending moment and in a second direction equal and opposite to the first direction, wherein the first and second piezoelectric actuation bending moments generate lateral displacements of the actuator beam, and wherein the actuator beam comprises positive and negative deflection regions.

The actuator may further comprise a mechanically compliant spring assembly and a secondary spring component parallel to a longitudinal axis of the actuator beam, wherein the secondary spring component couples the actuator beam to the mechanically compliant spring assembly, wherein the compliant spring assembly allows for large lateral displacements of the actuator beam and supports vertical loads imposed upon a combination of the actuator beam and the compliant spring assembly, wherein a first end of the actuator beam is coupled to the silicon substrate, and wherein the second end of the actuator beam is coupled to the mechanically compliant spring assembly.

The actuator may further comprise a mechanically compliant spring assembly comprising a cantilever spring oriented perpendicular to the actuator beam; and a secondary spring component parallel to a longitudinal axis of the actuator beam, wherein the secondary spring component couples the actuator beam to the mechanically compliant spring assembly, wherein a first end of the actuator beam is coupled to the silicon substrate, and wherein a second end of the actuator beam is coupled to the mechanically compliant spring assembly. Moreover, the actuator may further comprise a first curved flexural beam comprising a pair of ends; and a second curved flexural beam comprising a pair of ends, wherein the actuator beam is coupled to both ends of each of the first curved flexural beam and the second curved flexural beam, and wherein one of the first curved flexural beam and the second curved flexural beam is coupled to the silicon substrate at a midpoint of the flexural beam.

Additionally, the actuator may further comprise a plurality of actuator beams connected in parallel. Also, the actuator may further comprise a plurality of actuator beams connected in series; and a rigid support frame attached to an outer one of the plurality of actuator beams, wherein a centrally located one of the actuator beams comprises a first attachment connecting to a middle of the rigid support frame; a second attachment to the mechanically compliant spring assembly; and electrode traces connected to the first and second electrodes. Preferably, both the first electrode and the second electrode supply a voltage to both positive and negative deflection regions of the actuator beam.

Another embodiment provides a method of producing lateral displacements in a piezoelectric MEMS actuator, the actuator comprising a silicon substrate; an actuator beam comprising a first end region connected to the silicon substrate and a second end region connected to a mechanically compliant spring assembly; a first electrode over the silicon substrate; a piezoelectric layer above the first electrode; a second electrode over the piezoelectric layer; a conductive top structural layer above the second electrode, wherein a center section of the actuator beam is configured as a positive or negative deflection region, and wherein the end regions of the actuator beam are configured as the opposite deflection regions of the center section, the method comprising applying a voltage between the first electrode and the second electrode; producing a vertical displacement through the actuator beam in the positive and negative deflection regions; and producing a lateral displacement using the mechanically compliant spring assembly in conjunction with the vertical displacement. Preferably, both the first electrode and the second electrode supply voltage to both positive and negative deflection regions of the actuator beam.

The method may further comprise coupling a secondary spring component parallel to a longitudinal axis of the actuator beam, wherein the secondary spring component couples the actuator beam and the mechanically compliant spring assembly. Also, the mechanically compliant spring assembly comprises a cantilever spring oriented perpendicular to the actuator beam, and wherein the method further comprises coupling a secondary spring component parallel to a longitudinal axis of the actuator beam, wherein the secondary spring component is coupled to the actuator beam and the mechanically compliant spring assembly. Moreover, the method may further comprise coupling the actuator beam to both ends of each of a first curved flexural beam and a second curved flexural beam, wherein one of the first curved flexural beam and second curved flexural beam is coupled to the silicon substrate. Additionally, the method may further comprise operatively connecting a plurality of actuator beams in parallel. The method may also further comprise configuring a plurality of actuator beams in series.

Another embodiment provides a method of fabricating a MEMS actuator beam comprising oppositely positioned distal ends and capable of producing piezoelectric actuation bending moments to generate lateral actuator displacements, the method comprising attaching a silicon substrate having a first thickness to one of the distal ends; positioning a dielectric layer having a second thickness less than the first thickness above the silicon substrate; forming a first electrode having a third thickness less than the first thickness above the dielectric layer; positioning a piezoelectric layer having a fourth thickness greater than the second or third thicknesses above the first electrode; forming a second electrode having a fifth thickness substantially equal to or less than the third thickness and positioned above the piezoelectric layer; and positioning a conductive structural layer having a sixth thickness greater than the third thickness above the second electrode, wherein a central region of the actuator beam produces a first piezoelectric actuation bending moment in a first direction, wherein the distal ends produce a second piezoelectric actuation bending moment equal to the first piezoelectric bending moment and in a second direction equal and opposite to the first direction, wherein the first and second piezoelectric actuation bending moments generate lateral displacements of the actuator beam, wherein the actuator beam comprises positive and negative deflection regions, and wherein both the first electrode and the second electrode supply a voltage to both positive and negative deflection regions of the actuator beam.

The method may further comprise providing a mechanically compliant spring assembly; and positioning a secondary spring component parallel to a longitudinal axis of the actuator beam, wherein the secondary spring component couples the actuator beam to the mechanically compliant spring assembly, wherein the compliant spring assembly is configured to support vertical loads imposed upon a combination of the actuator beam and the compliant spring assembly, wherein a first end of the actuator beam is coupled to the silicon substrate, and wherein the second end of the actuator beam is coupled to the mechanically compliant spring assembly. Also, the method may further comprise providing a mechanically compliant spring assembly comprising a cantilever spring oriented perpendicular to the actuator beam; and positioning a secondary spring component parallel to a longitudinal axis of the actuator beam, wherein the secondary spring component couples the actuator beam to the mechanically compliant spring assembly, wherein a first end of the actuator beam is coupled to the silicon substrate, and wherein a second end of the actuator beam is coupled to the mechanically compliant spring assembly.

Also, the method may further comprise providing a first curved flexural beam comprising a pair of ends; and providing a second curved flexural beam comprising a pair of ends, wherein the actuator beam is coupled to both ends of each of the first curved flexural beam and the second curved flexural beam, and wherein one of the first curved flexural beam and the second curved flexural beam is coupled to the silicon substrate at a midpoint of the flexural beam. Additionally, the method may further comprise connecting a plurality of actuator beams in parallel. Moreover, the method may further comprise connecting a plurality of actuator beams in series; and attaching a rigid support frame to an outer one of the plurality of actuator beams, wherein a centrally located one of the actuator beams comprises a first attachment connecting to a middle of the rigid support frame; a second attachment to the mechanically compliant spring assembly; and electrode traces connected to the first and second electrodes.

Also, the method may further comprise fabricating a piezoelectric lateral actuator with an integrated mechanically compliant spring assembly, wherein the fabricating process comprises forming a passivation layer on the vertical and top sides of the compliant spring assembly; and positioning openings in the passivation layer on the vertical surfaces of the longitudinal edges of the actuator beam to allow removal of the silicon substrate. Furthermore, the fabricating process may further comprise positioning the openings at a distance greater than the sum of the width of the passivation layer and half the width of the actuator beam from the connection between the actuator beam and the mechanically compliant spring assembly. In one embodiment, the passivation layer comprises a photodefineable material. In another embodiment, the passivation layer comprises a material resistant to the process used to remove the silicon substrate from the actuator beam.

Another aspect of the embodiments herein provides a piezoelectric MEMS actuator that produces piezoelectric actuation bending moments to generate lateral actuator displacements, the actuator comprising an actuator beam comprising oppositely positioned distal ends; a silicon substrate having a first thickness and attached to one of the distal ends; a first dielectric layer having a second thickness less than the first thickness and positioned above the silicon substrate; a mechanically compliant spring layer having a third thickness less than the first thickness and positioned above the first dielectric layer; a second dielectric layer having a fourth thickness less than the first thickness and positioned above the mechanically compliant spring layer; a first electrode having a fifth thickness less than the first thickness and positioned above the second dielectric layer; a piezoelectric layer having a sixth thickness greater than the fourth and fifth thicknesses and positioned above the first electrode; a second electrode having a seventh thickness substantially equal to or less than the fifth thickness and positioned above the piezoelectric layer; and a conductive structural layer having an eighth thickness greater than the fifth thickness and positioned above the second electrode, wherein a central region of the actuator beam produces a first piezoelectric actuation bending moment in a first direction, wherein the distal ends produce a second piezoelectric actuation bending moment equal to the first piezoelectric bending moment and in a second direction equal and opposite to the first direction, wherein the first and second piezoelectric actuation bending moments generate lateral displacements of the actuator beam, and wherein the actuator beam comprises positive and negative deflection regions. Moreover, the actuator comprises a piezoelectric lateral actuator with at least one integrated mechanically compliant spring assembly, wherein the actuator is fabricated by forming a passivation layer on the vertical and top sides of the compliant spring layer and the vertical sides of first dielectric layer on the mechanically compliant spring assembly; and positioning openings in the passivation layer on the vertical surfaces of the longitudinal edges of the actuator beam to allow removal of the compliant spring layer and the silicon substrate beneath the actuator beam.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 3A is a schematic diagram illustrating a poled tetragonal unit cell of PZT;

FIGS. 14A through 25 are schematic diagrams illustrating subsequent processing steps used to manufacture a clamped-clamped spring assembly according to an embodiment herein.

DETAILED DESCRIPTION OF PREFERRED EMBODIMENTS

Figure 1A:
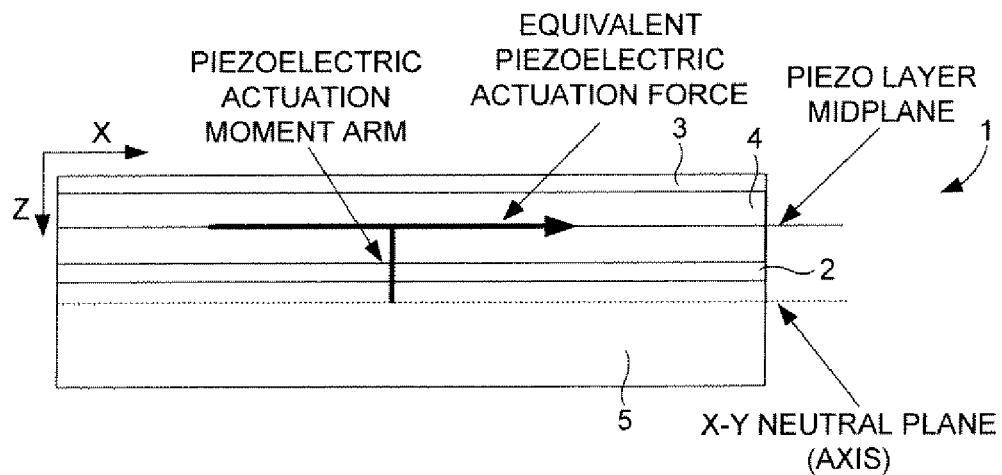
FIG. 1A is a schematic diagram of a cross-sectional view of a conventional piezoelectric MEMS unimorph actuator.
Figure 1B:
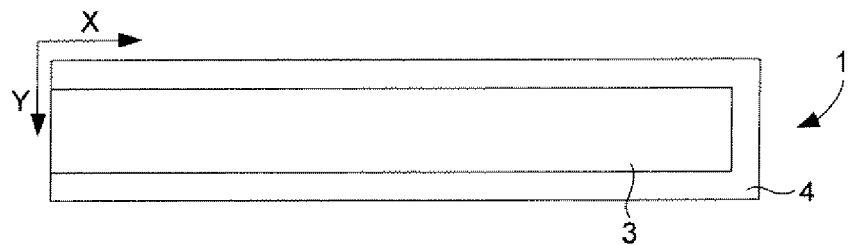
FIG. 1B is a schematic diagram of a top view of a conventional piezoelectric MEMS unimorph actuator.
Figure 2:
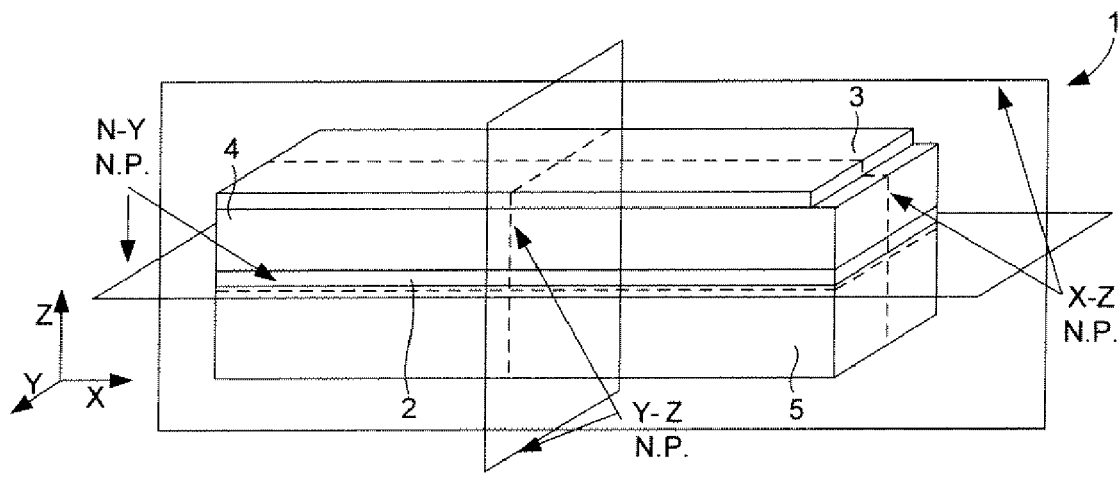
FIG. 2 is a schematic diagram of a perspective view of a conventional piezoelectric MEMS unimorph actuator.
Figure 3B:
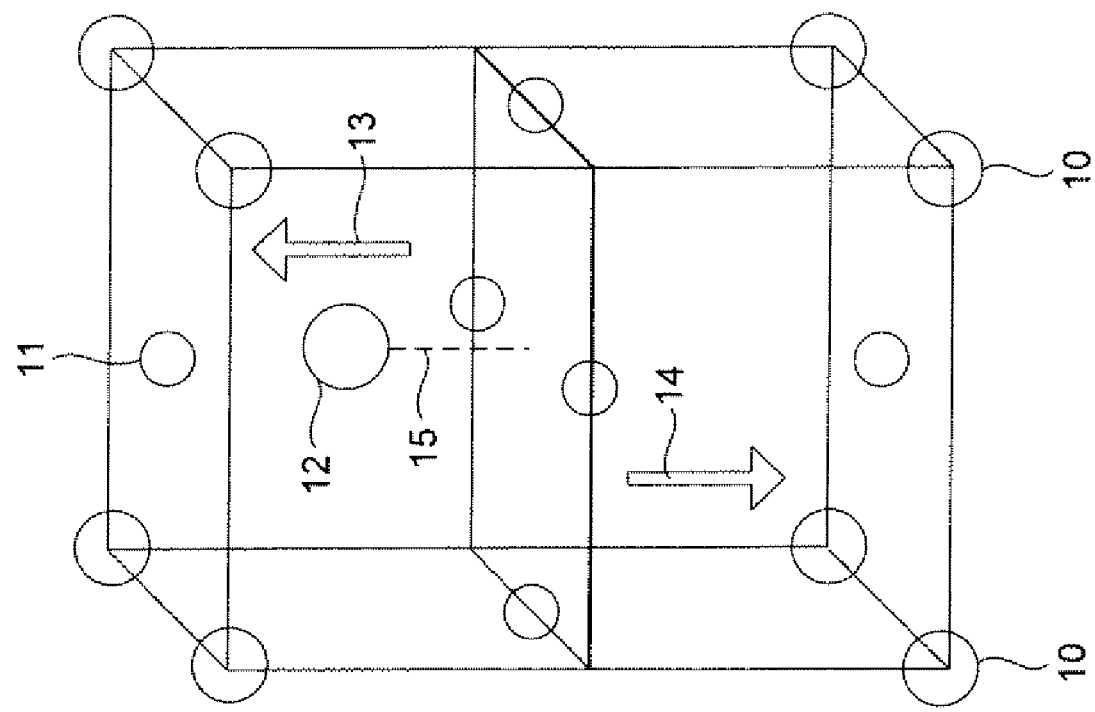
FIG. 3A is a schematic diagram illustrating a unit cell of a cubic, nonpiezoelectric, unit cell of PZT.
Figure 3A:
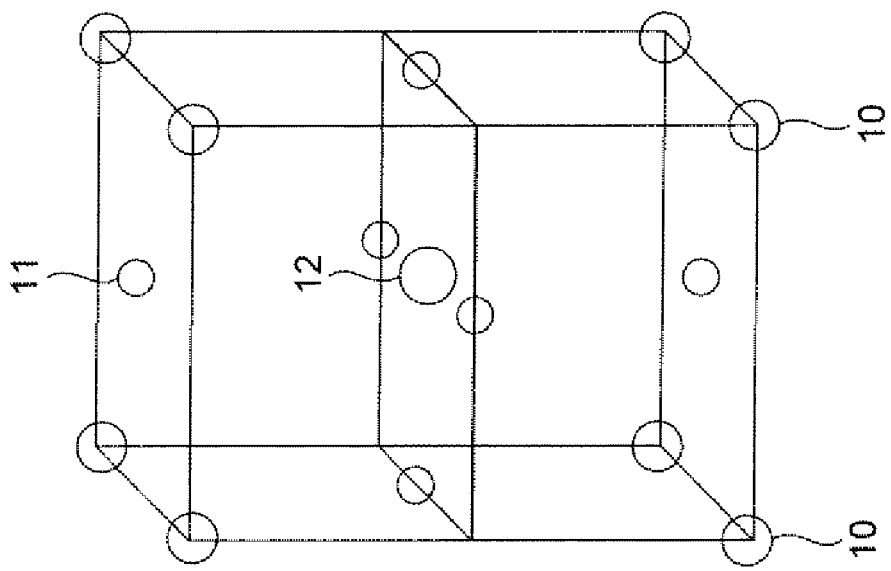
Figure 4B:
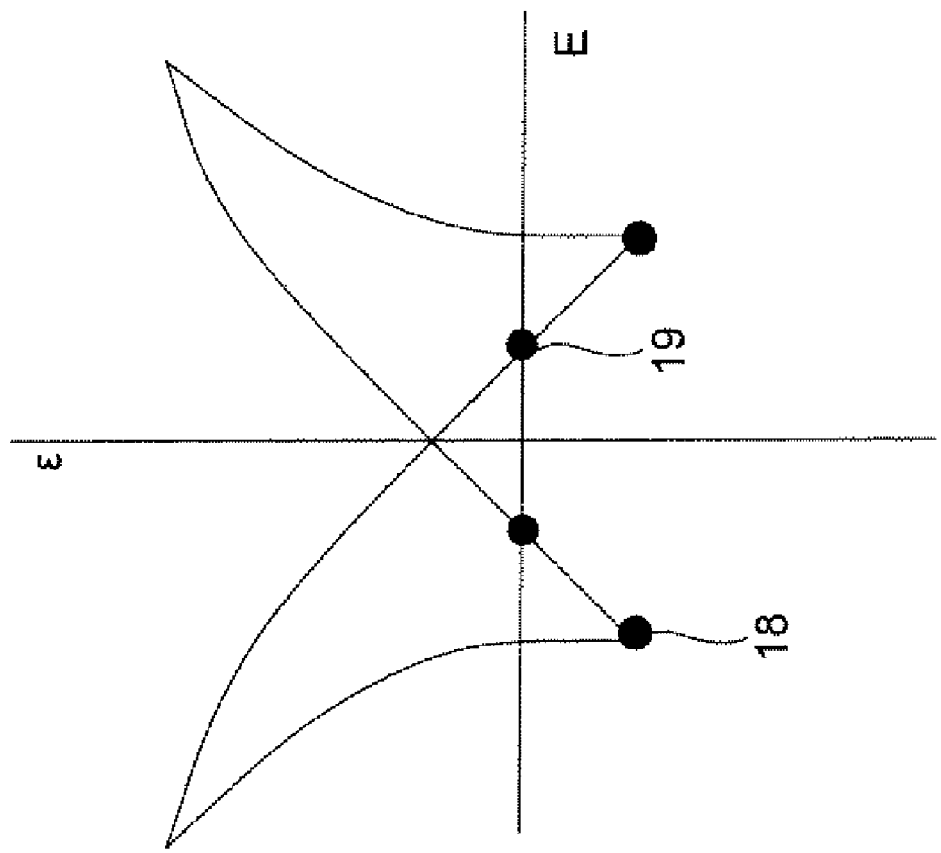
FIG. 4B is a schematic diagram illustrating a ferroelectric hysteresis loop depicting the relationship between the electric field and strain (butterfly loop)
Figure 4A:
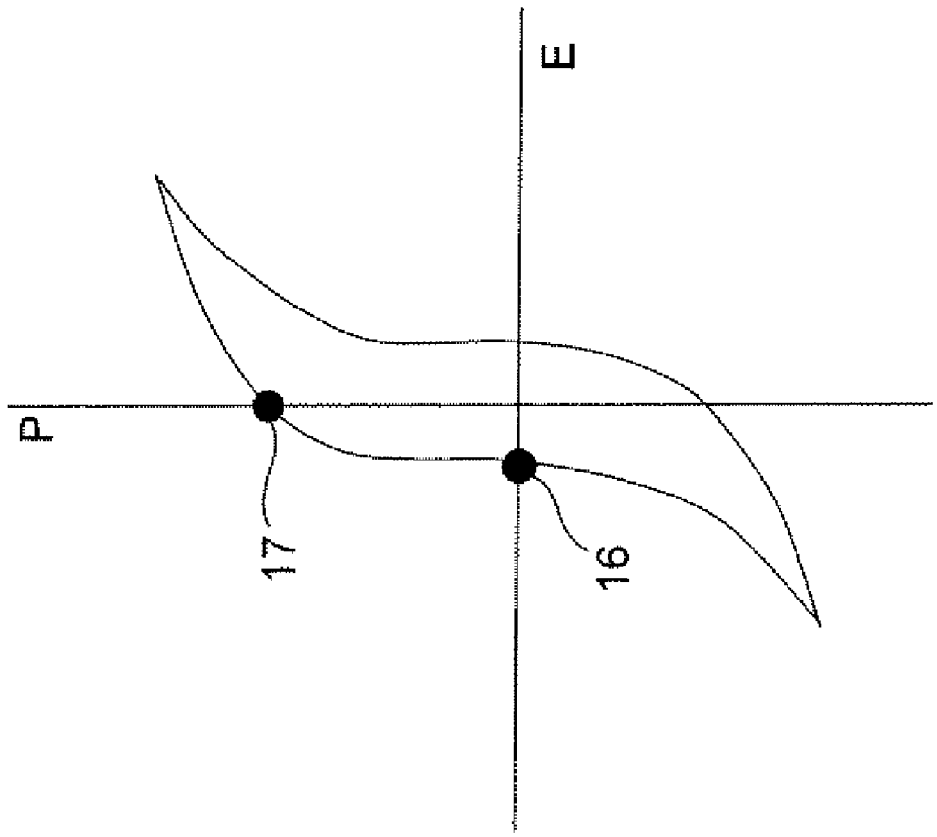
FIG. 4A is a schematic diagram illustrating a ferroelectric hysteresis loop depicting the relationship between the electric field and polarization.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a piezoelectric MEMS actuator that can produce significant lateral displacement and force by configuring the central section of a piezoelectric MEMS beam as a positive or negative deflection actuator and the remaining sections of the MEMS beam as the opposite deflection actuators Referring now to the drawings, and more particularly to FIGS. 5 through 26, where similar reference characters denote corresponding features consistently throughout the figures, there are shown preferred embodiments.

Figure 5:
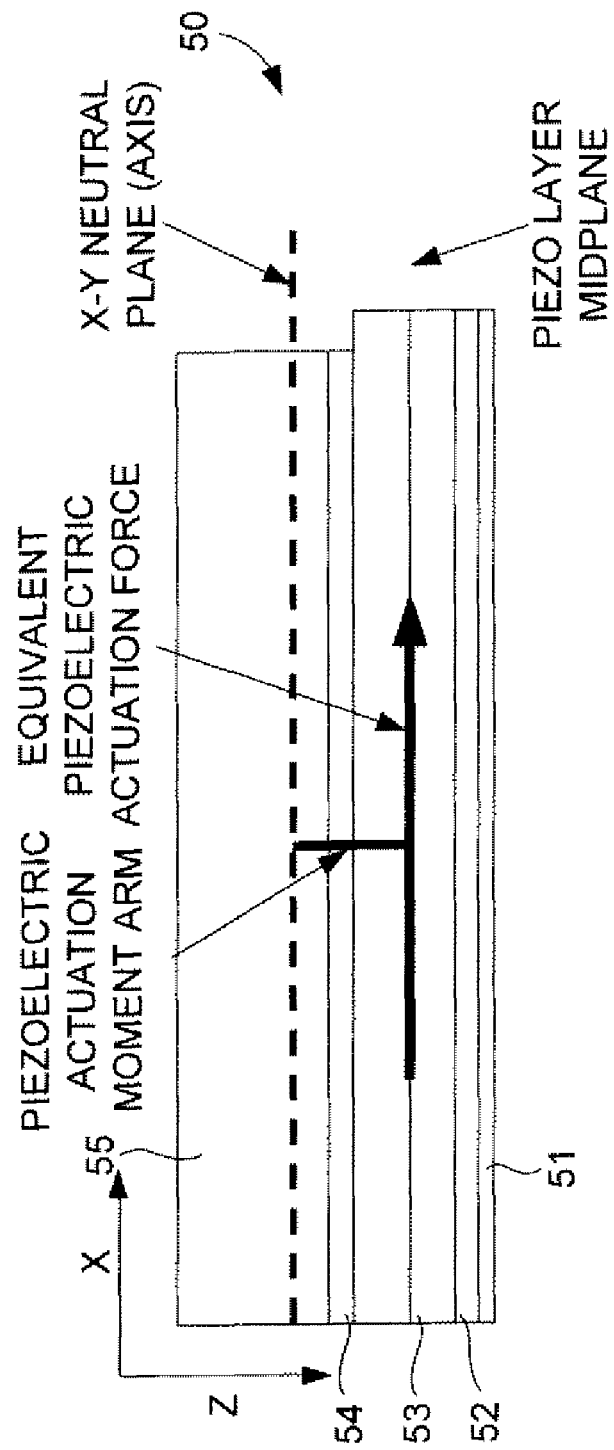
FIG. 5 is a schematic diagram of a cross-sectional view of a negative vertical deflection piezoelectric MEMS actuator according to an embodiment herein.
Figure 6:
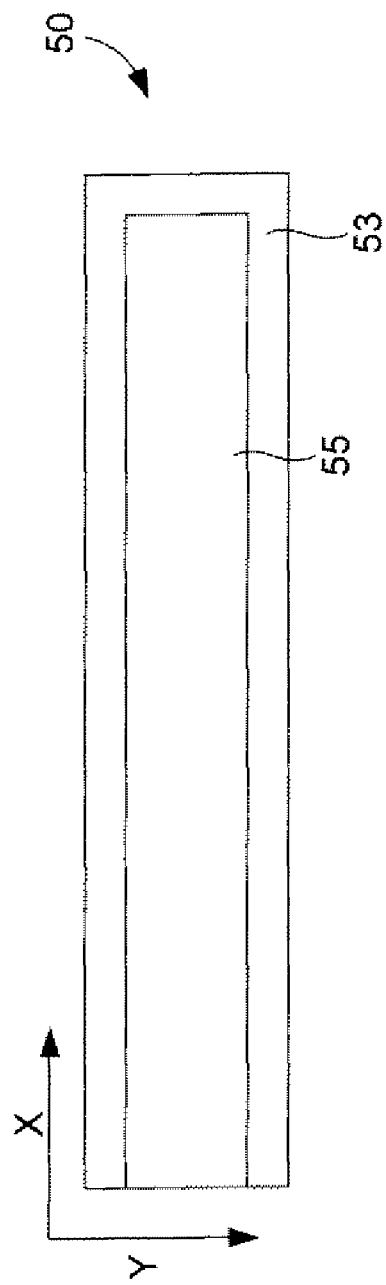
FIG. 6 is a schematic diagram of a top view of a negative vertical deflection piezoelectric MEMS actuator according to an embodiment herein.

FIGS. 5 and 6 illustrate a negative vertical deflection piezoelectric MEMS actuator 50 according to an embodiment herein. FIG. 5 is a cross-sectional view and FIG. 6 is a top down view. The actuator beam 50 may be embodied in any configuration including, but not limited to, rectangular in shape. The beam 50 can be varied in length from approximately 100-1000 microns. The positive and negative deflection regions of the actuator 50 are typically divided at the quarter length points of the effective actuator length. The actuator 50 is embodied as a piezoelectric composite stack comprising of a plurality of layers. The bottom layer is a dielectric layer 51 approximately 1,200 Å or less in thickness. The next layer is the bottom electrode layer 52 and is approximately 700 Å in thickness. The next layer is the active piezoelectric layer 53 and is approximately 5,000 Å in thickness. The next layer is the top electrode layer 54 and is also approximately 700 Å in thickness. The top structural layer 55 does not necessarily have to be a metal but may be, and the thickness of the top structural layer 55 depends on the material properties and thicknesses of the other layers as well as it's own mechanical properties. The optimal device layer 61 (of FIGS. 14A and 14B) thicknesses for maximum free actuator deflection may be obtained by maximizing and matching the absolute value of the free deflections of both negative and positive deflection cantilever devices. The thickness of the device layer 61 (of FIGS. 14A and 14B) of the SOI substrate 60 (of FIG. 14B) is variable depending upon the application requirements. Generally, a thickness between approximately 5-20 microns yields positive performance for a vast number of applications. The buried silicon dioxide layer 62 (of FIGS. 14A and 14B) of the SOI substrate 60 is preferably as thin as possible; constrained only by the minimum thickness required for adequate passivation of the bottom of the spring assembly components (shown in FIGS. 23A and 23B) during the subsequent $XeF_2$ etch release. The buried silicon dioxide layer 62 is preferably less than approximately 1,000 Å in thickness.

The top electrode layer 54 and the top structural layer 55 (if conductive) are offset (in the x-y plane) from the edge of the actuator 50, the x-z exposed faces of the piezoelectric layer 53, by a distance of greater than approximately three microns. This allows the application of large electric fields between the electrode layers 52, 54 without the risk of electrical breakdown of the air between the top and bottom electrode layers 54, 52 by increasing the effective distance between them.

The top electrode trace 66 (of FIGS. 7 and 8) that is not on the actuator beam 50 and is located on the substrate 60 (of FIGS. 14A and 14B) resides on the etched structural dielectric layer 51. Although the traces 66 and bond pads 67 could more easily be fabricated on the piezoelectric layer 53, they are placed on the silicon dioxide layer 51 as opposed to the PZT layer 53 to minimize capacitance and thus minimize the power consumption of the actuator 50. Any traces or bond pads on the PZT layer 53 would necessarily increase the capacitance without enhancing the performance of the actuator 50 as any PZT region necessarily is situated upon the bottom electrode layer 52, forming a capacitor. As the power consumption of the actuator 50 is proportional to the capacitance of the actuator 50; it is desirable to remove the PZT layer 53 and bottom electrode layer 52 from beneath the trace 66 and bond pad 67 locations. For this reason, the top electrode trace 66 is comprised of the top structural layer 55 conductor material and resides directly on the etched structural dielectric layer 51 on the substrate 60.

Figure 8:
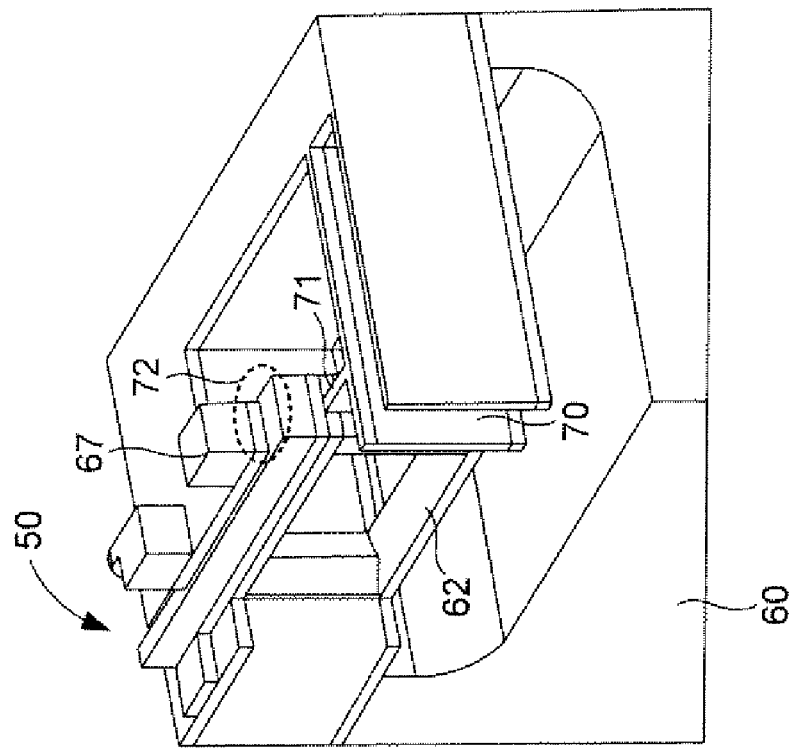
FIG. 8 is a schematic diagram illustrating a perspective view of a clamped-clamped spring assembly according to an embodiment herein.
Figure 7:
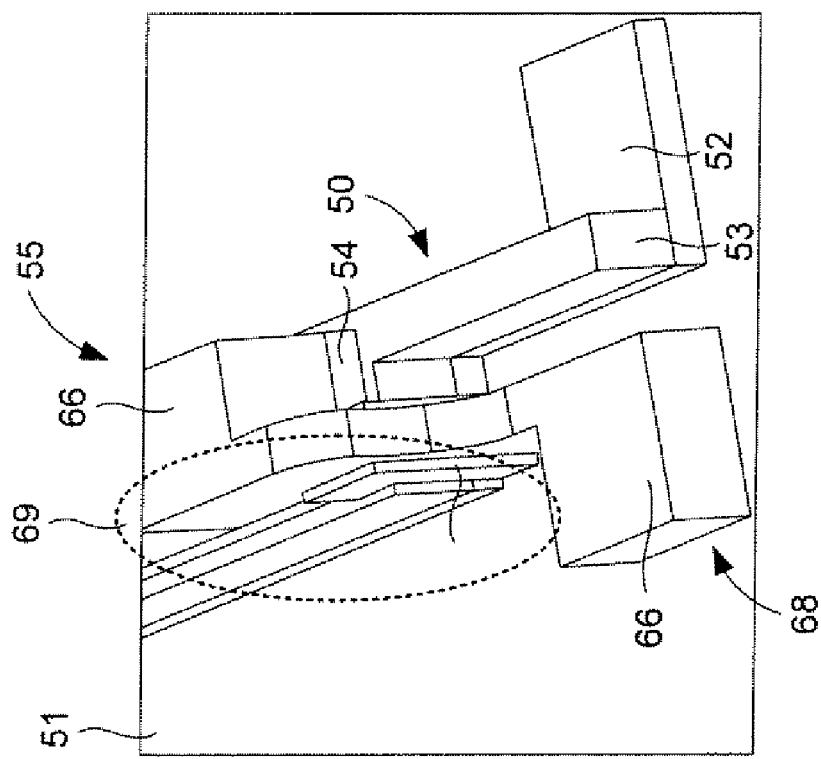
FIG. 7 is a schematic diagram illustrating a magnified view of a dielectric passivation strap of a clamped-clamped spring assembly according to an embodiment herein.

As can be seen in FIG. 7, shorting of the top 54 and bottom 52 electrodes is prevented by a dielectric passivation feature 68 that is constructed on the exposed bottom electrode/Piezo/top electrode sidewall 69 at the location where the top structural layer 55 (conductive) descends from the top electrode region 54 to the top electrode trace 66. As shown in FIG. 8, there is a silicon dioxide layer 62 beneath the piezoelectric actuator beam 50. This layer 62 is fixed to the substrate 60 and to the spring attachment 70 location at the same location as the actuator beam 50. The compliant spring assembly 70 is best created by using a SOI, silicon on insulator, substrate 60 to create single crystal silicon structural components. Due to the preferred release process, $XeF_2$, the silicon spring assembly 70 utilizes etch passivation beneath those silicon features. The buried oxide layer 62 of the SOI substrate 60 allows for such a feature. This layer 62 is designed to be very thin and typically possesses some level of residual stress.

The connection between the actuator beam 50 and the spring assembly 70 is made by means of an additional spring component 71 that is parallel to the longitudinal axis of the actuator beam 50 and is attached preferably to the middle of the actuator beam 50. This spring member 71 provides flexibility to the connection in the width dimension of the actuator beam 50 and minimizes the bending stiffness of the spring assembly 70 at the attachment location, thereby increasing the performance of the actuator 50. The flexibility in the width dimension is advantageous in spring assembly configurations that utilize pseudo-rotational motion of the spring assembly 70 about a single anchor point (i.e., cantilever configurations). The width of the spring 71 is approximately five microns and the length of the spring 71 depends largely upon the configuration of the remainder of the actuator 50 and spring assembly 70, but is approximately on the order of 100 microns. The region 72 between the spring 71 and the end of the actuator beam 50 is comprised of a non-actuated (no top electrode) beam section of the same width as the actuator beam 50. This region 72 ensures that rigid attachment of the actuator beam 50 to the spring assembly 70 is not sensitive to process variability in the release etch time. Without this region 72, an over etch could potentially leave the connection between the spring assembly 70 and the actuator beam 50 as the thin spring attachment section 71 comprised only of the piezoelectric composite materials. The actuator 50 would not be mechanically constrained along the full width of that end of the actuator beam 50. This would lead to poor performance of the actuator 50. The length of region 72 is preferably approximately 40 microns, but depends on the width of the actuator beam 50. As can be seen in FIG. 8, the $XeF_2$ release etch yields the characteristic curved circular etch profile of an isotropic etch process in the etched device silicon layer substrate 60. Regions of the substrate 60 adjacent to the actuator 50 and the spring assembly 70 are removed to allow unrestricted motion of the actuator 50.

Figure 9:
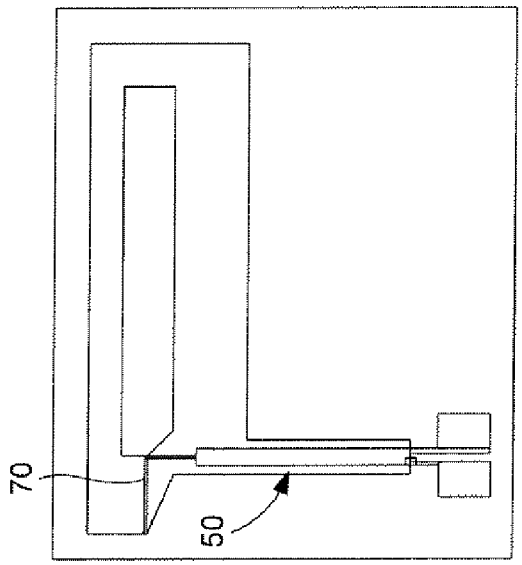
FIG. 9 is a schematic diagram illustrating a top view of a clamped-clamped spring assembly according to an embodiment herein.
Figure 10:
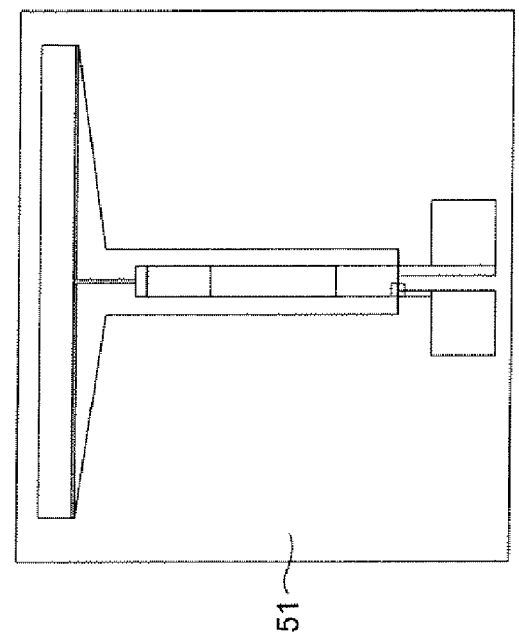
FIG. 10 is a schematic diagram illustrating the mechanical advantage attained using a perpendicular cantilever spring assembly according to an embodiment herein.

The overall configuration of the actuator 50 and spring assembly 70 is subject to multiple configurations. FIG. 9 illustrates the general configuration. To provide large displacements with the embodiments herein, mechanical advantage configurations are employed with the compliant spring assembly 70 that couples to the actuator 50 as indicated in FIG. 10.

The basic configuration utilizes a large force and displacement piezoelectric MEMS lateral actuator to produce a small lateral displacement at the end of a short cantilever spring 70, oriented perpendicular to the actuator 50. This small lateral displacement translates to a larger angular displacement as the cantilever spring beam length shortens. An optimal configuration exists for the length of this spring 70 to produce the largest attainable angular displacement. The optimal configuration is a function of the actuator 50 and spring 70 geometry, the material properties, and actuation voltage. The large angular displacement at the free end of the cantilever spring 70 can produce very large lateral translational displacements by simply lengthening the section of the spring 70 as shown in FIG. 10.

Figure 11:
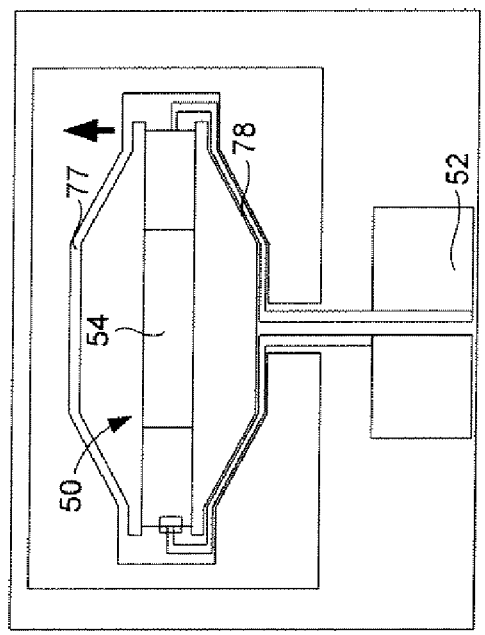
FIG. 11 is a schematic diagram illustrating a Cymbal-like design according to an embodiment herein.

The embodiments herein also allow for a modification to the well-known "Moonie" and "Cymbal" macro-piezoelectric actuator configurations. Whereas these designs utilize purely extensional macro-scale "piezoelectric stack" actuators, the embodiments herein utilize the large force and displacement piezoelectric MEMS lateral actuator, a unimorph bender technology, to provide the axial motion that is amplified by the configuration. As shown in FIG. 11, the actuator 50 is situated between two slightly curved flexural beams 77, 78 and is attached at both ends to each flexural beam 77, 78. One of these flexural beams 78 is then fixed to the substrate 60. The electrode traces for the top and bottom electrodes are located on flexural beam 78 and connect to the substrate and any requisite on-substrate traces or electrode contacts (bond pads). Like the macro-scale designs, these MEMS variants may also be combined in series and parallel in a similar fashion. The upwards arrow in FIG. 11 indicates the direction of motion.

Figure 12:
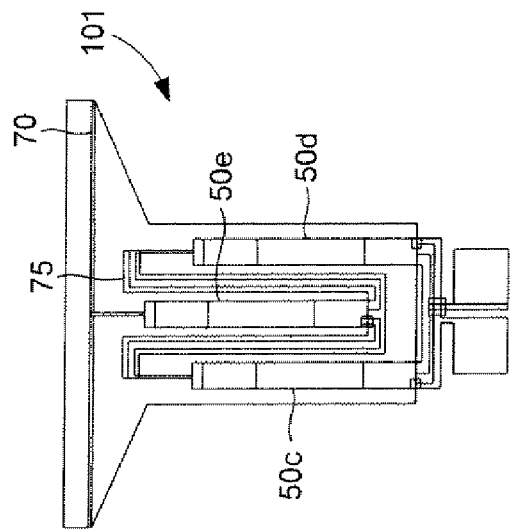
FIG. 12 is a schematic diagram illustrating parallel actuators in a clamped-clamped spring assembly according to an embodiment herein.
Figure 13:
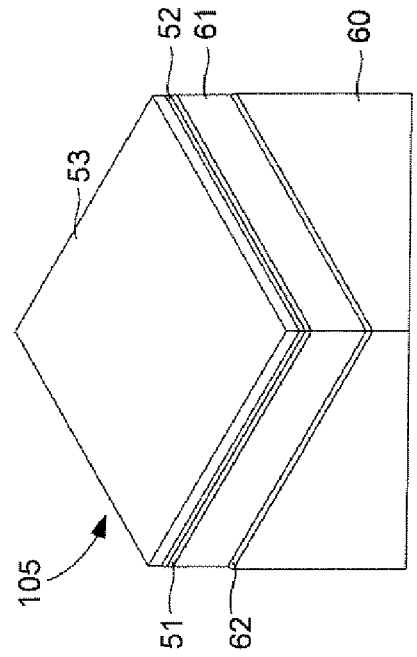
FIG. 13 is a schematic diagram illustrating series actuators in a clamped-clamped spring assembly according to an embodiment herein.

To enhance the actuation force capability of the device 100, a plurality the piezoelectric actuator beams 50a, 50b may be combined in parallel to increase actuation force production as in FIG. 12. This configuration allows for beam-like behavior as two-dimensional plate-like behavior can diminish actuator performance. Secondly, it also minimizes the release etch time, a desirable manufacturing attribute, required to remove the substrate material 60 beneath the actuators 50a, 50b. To enhance the actuation displacement capability, the actuators 50 may also be combined in series as indicated in FIG. 13. In the most basic configuration, two piezoelectric actuator beams 50c, 50d flank a third actuator beam 50e. These outer actuator beams 50c-50e are attached by a rigid support frame 75. This rigid support frame 75 is shaped generally in a "U" shape to minimize the footprint of the device 101. The middle actuator beam 50e attaches to the middle of the rigid support frame 75. This middle actuator beam 50e then attaches to the compliant spring assembly 70 by any of the previously identified mechanisms above. The electrode traces of the middle actuator 50e are divided by top and bottom electrodes. Each of these contact the respective top or bottom electrode of the flanking actuators 50c, 50d by means of traces located on the connection beam (spring 71) (of FIG. 8), and the "U" shaped rigid support frame 75. Moreover, in FIG. 13, the actuator 50c provides the top electrode trace and the actuator 50d provides the bottom electrode trace. Furthermore, multiple configurations for this embodiment are possible.

Figure 14A:
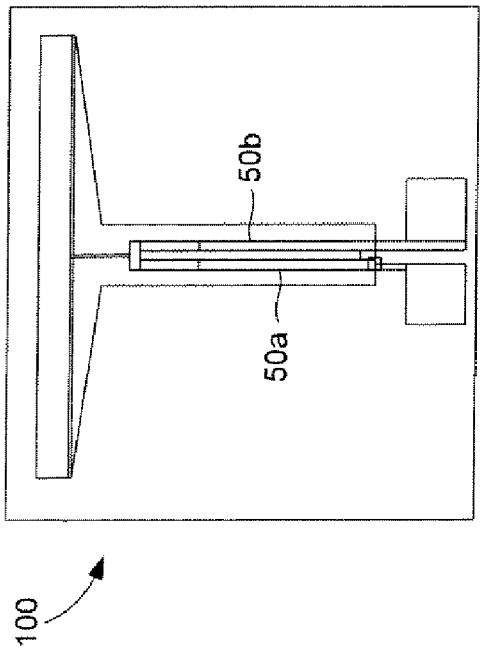
Figure 14B:
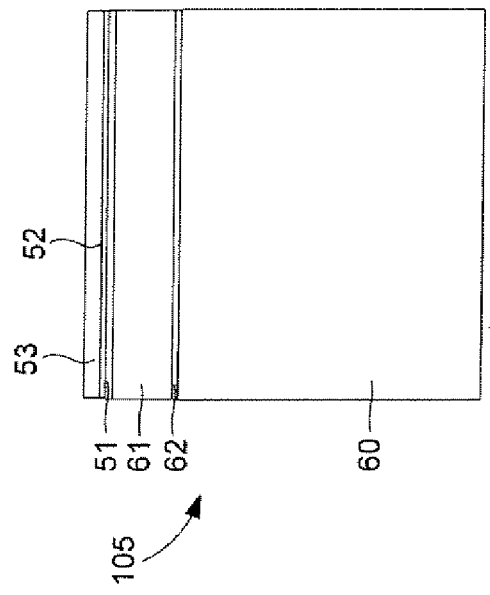
Figure 16B:
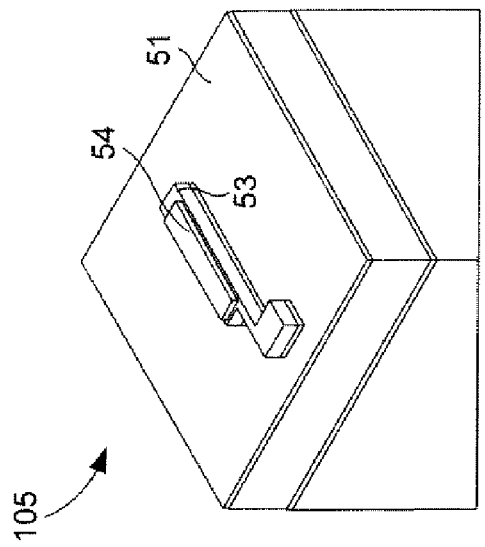

There are many possible fabrication processes which may be utilized for manufacturing the embodiments herein. In this regard, the steps listed below are not exclusive as other materials are possible alternatives as well. Furthermore, the thicknesses given below are approximate and may be changed to suit design optimization. FIGS. 14A through 23B depict the fabrication process according to an embodiment herein. FIG. 14A illustrates a cross-sectional view and FIG. 14B illustrates an orthogonal view of the starting piezoelectric wafer stack 105. The starting material and substrate 60 is a single crystal silicon on insulator (SOI) wafer. Next, a plasma enhanced chemical vapor deposition (PECVD) or thermal $SiO_2$ layer 62 (approximately 1,200 Å) is deposited. The stack 105 then undergoes a 700° C. $N_2$ atmosphere, 60-second annealing process. After a layer of silicon 61 and a structural dielectric layer 51 are formed, DC sputtered Ti/Pt is deposited as the bottom electrode material 52 (approximately 200 Å/550 Å).

After this, sol-gel or sputtered thin film PZT layer 53 is deposited (approximately 5,000 Å).

Figure 15B:
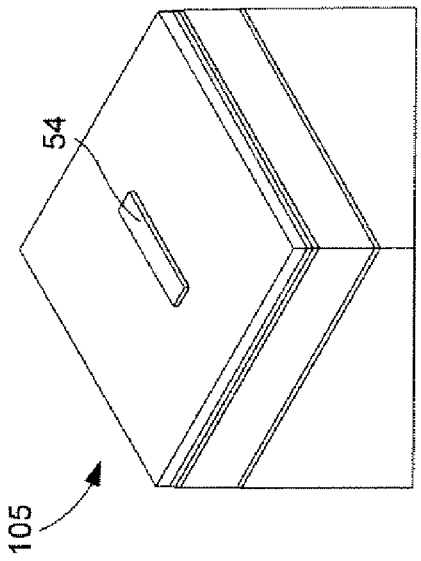
Figure 15A:
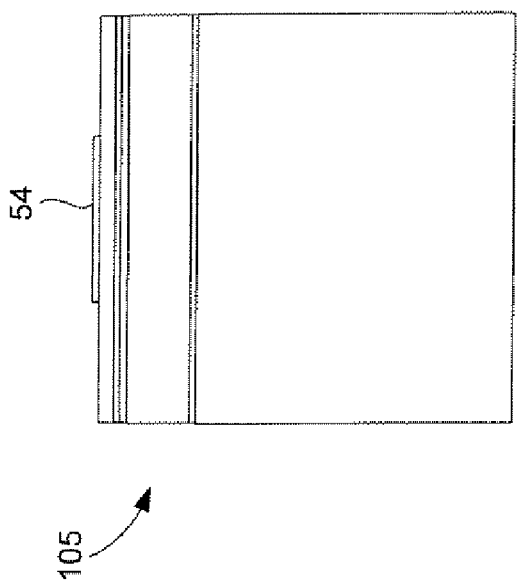
Figure 16A:
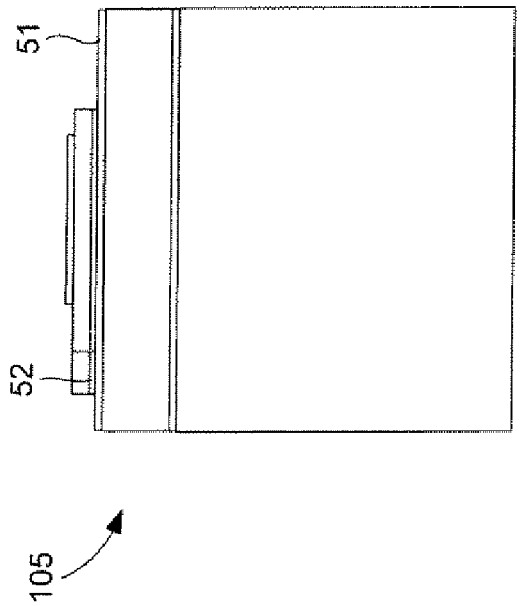
Figure 17B:
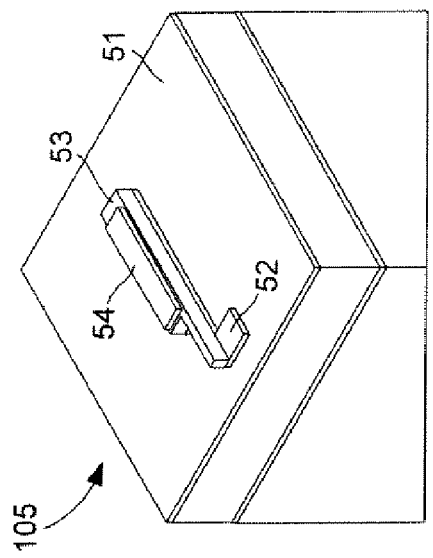
Figure 18B:
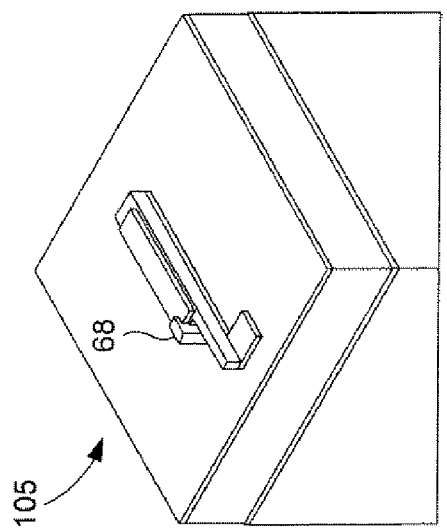
Figure 17A:
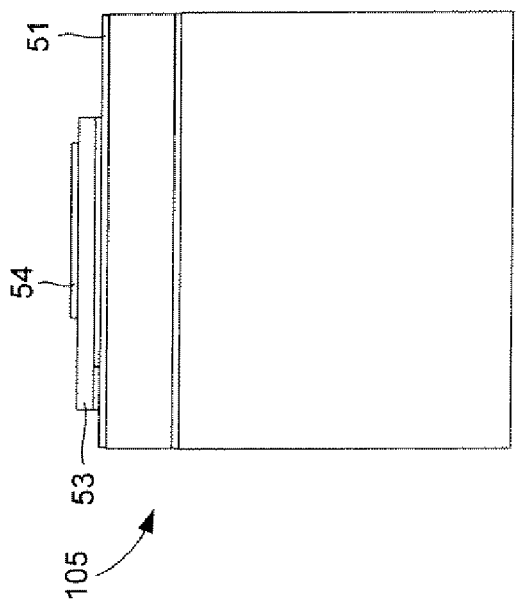
Figure 18A:
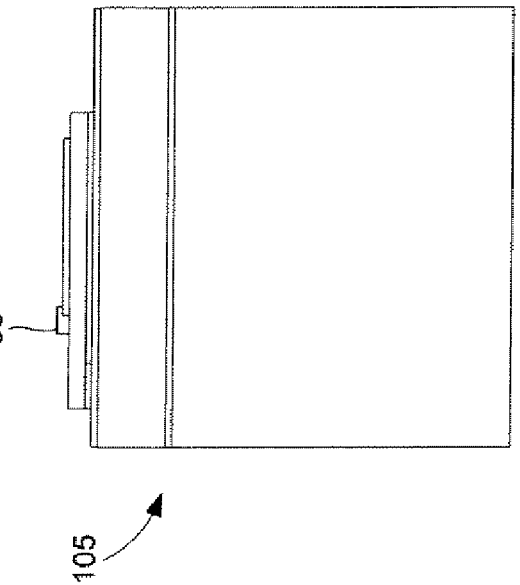

FIGS. 15A (cross-sectional view) and 15B (orthogonal view) illustrate the top electrode 54 patterning process. Here, a liftoff process or conformal deposition and etch hack with DC sputtered Pt occurs to define the top electrode 54 (approximately 700 Å). FIGS. 16A (cross-sectional view) and 16B (orthogonal view) illustrate an ion mill etching process of the PZT layer 53 and bottom electrode layer 52 to define actuator and bottom electrode 52 access points and/or bond pads down to the structural dielectric layer 51. FIGS. 17A (cross-sectional view) and 17B (orthogonal view) illustrate a wet etching process of the PZT layer 53 on bottom electrode 52 access points and/or bond pads. Thereafter, a conformal deposition of enhanced chemical vapor deposited $SiO_2$ (approximately 10,000 Å) occurs (not shown), which provides sidewall passivation to prevent shorting of electrode layers 52, 54 via the top structural metal layer 55 (of FIGS. 5 and 6). FIGS. 18A (cross-sectional view) and 18B (orthogonal view) illustrate a reactive ion etching (RIE) process of the deposited $SiO_2$ to pattern small electrical passivation features 68 over exposed edge of the top electrode/PZT/bottom electrode sidewall 69 (best shown in FIG. 7).

FIGS. 19A (cross-sectional view) and 19B (orthogonal view) illustrate a liftoff process with evaporated TiAu 55 (approximately 200 Å/9800 Å) to define the top electrode region 54 of active negative deflection actuator 50, the top bond pad 67, and top electrode traces 66 on exposed $SiO_2$ 68 to minimize stray capacitance and minimize actuator power consumption. In FIG. 7, the top structural metal layer 55 only contacts the $SiO_2$ 68 electrical passivation feature when descending from the actuator beam 50 towards the substrate region 60. FIGS. 20A (cross-sectional view) and 20B (orthogonal view) illustrate an RIE process of the $SiO_2$ layer 62 down to Si substrate 60. With the same photolithography mask (not shown), a deep reactive ion etch (DRIE) process of the device layer 61 of the SOI substrate 60 down to the buried oxide layer 62 occurs. Furthermore, with the same photolithography mask, a RIE process of the buried oxide layer 62 down to the handle silicon layer (SOI substrate 60) occurs. Moreover, with the same photolithography mask, a DRIE into the handle silicon layer (SOI substrate 60) occurs up to a few microns. This allows the forthcoming spring sidewall passivation process step to have complete encapsulation of the device layer silicon features 61.

Figure 23A:
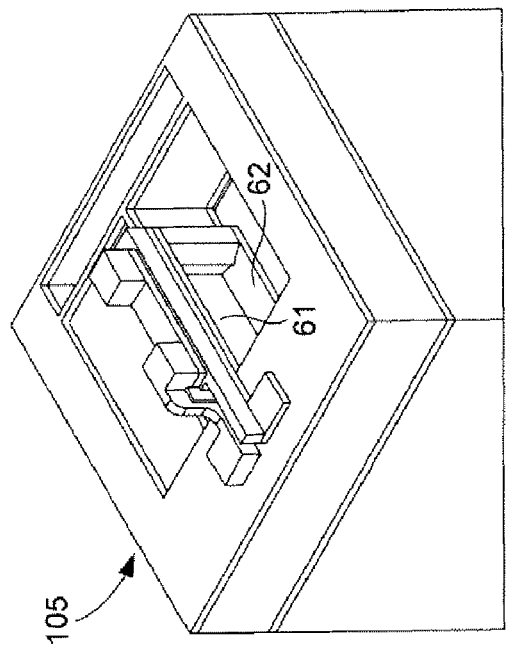
Figure 23B:
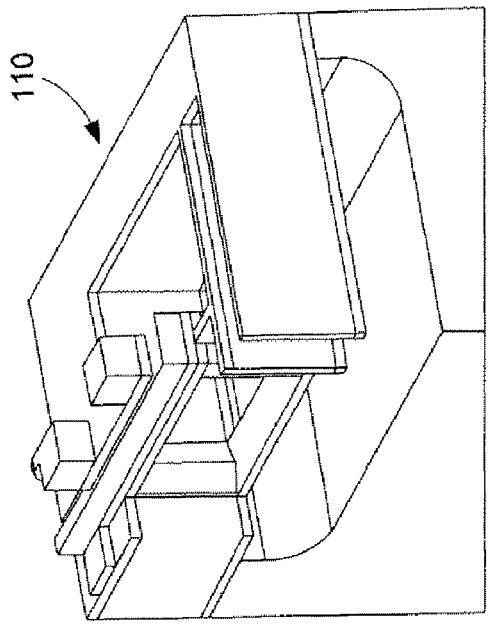
Figure 24A:
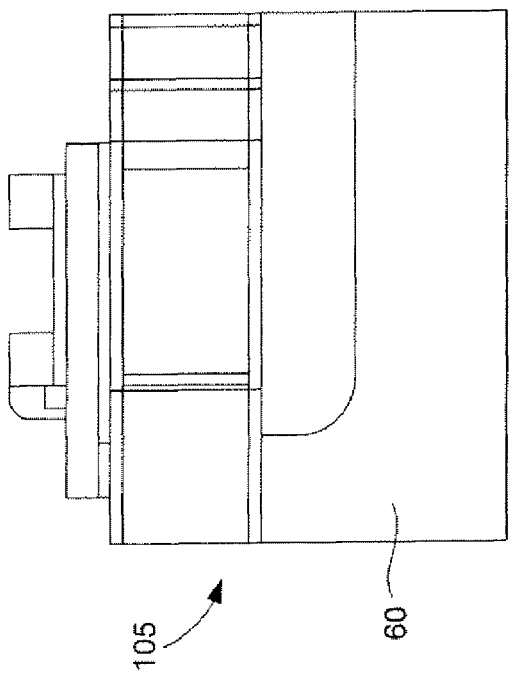
Figure 24B:
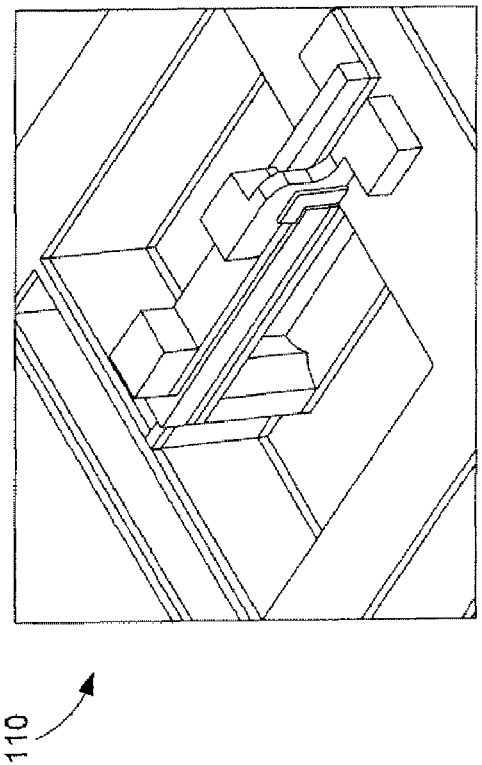
Figure 25:
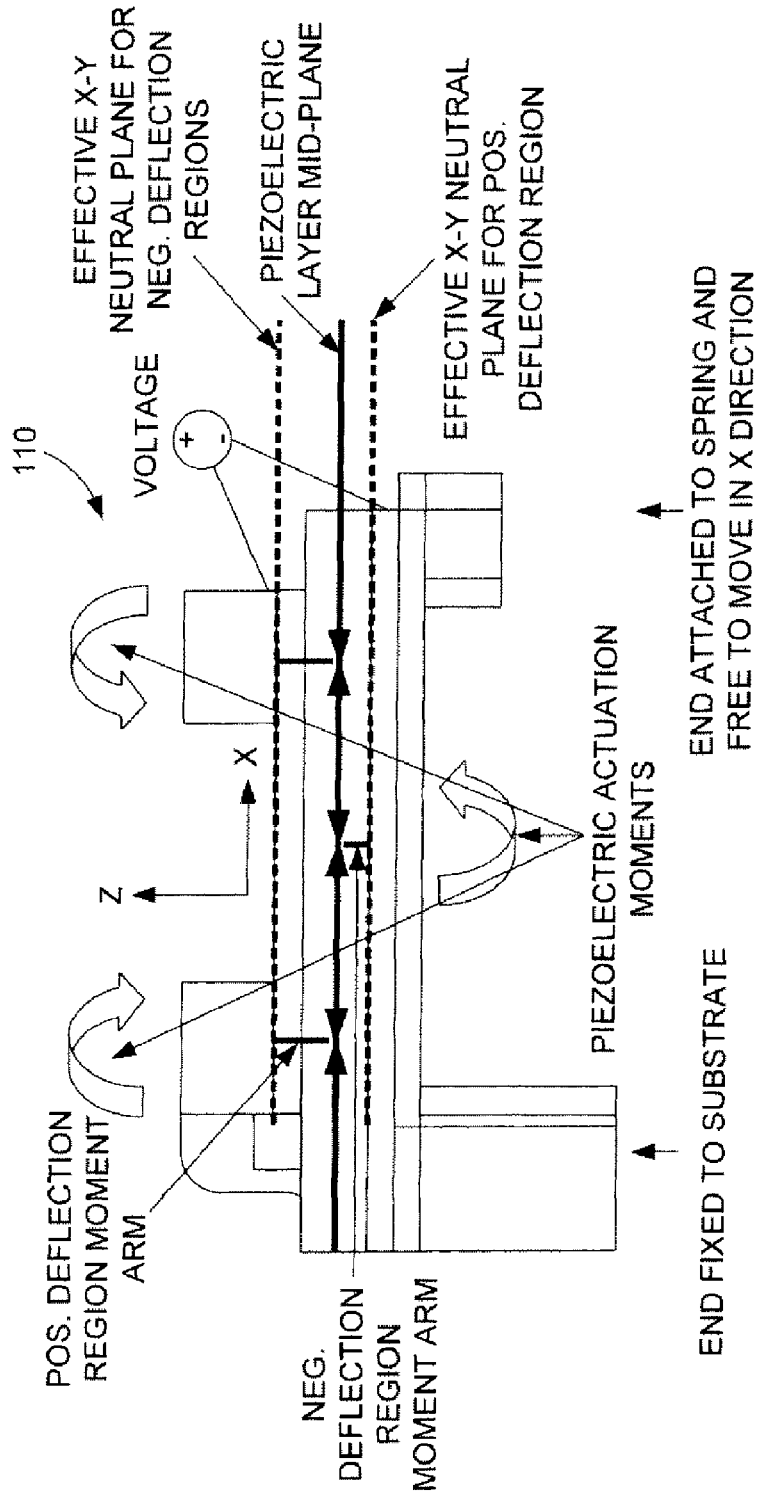

FIGS. 21A (cross-sectional view) and 21B (orthogonal view) illustrate a photolithography and ultra-violet cure step that patterns photoresist 80 onto the sidewalls of the exposed SOI spring features 70. To ensure proper coating of the sidewalls and top surface/sidewall functions, the photoresist thickness is on the order of the thickness of the silicon device layer thickness. Alternatively, spray coated photoresists may be used for resists unable to achieve thicknesses greater than one-half of the silicon device layer thickness. FIG. 22 illustrates a magnified view of FIG. 21B that illustrates that the sidewalls adjacent to the actuator beam 50 are not passivated; thus allowing release of the actuator beam 50. In other words, the device layer silicon 61 adjacent to most of the actuator beam 50 and the bottom of the large etched areas of the handle silicon layer (SOI substrate 60) are exposed, which allows the forthcoming $XeF_2$ etch to undercut both the piezoelectric actuator beam 50 and the SOI spring features 70. FIGS. 23A (cross-sectional view) and 23B (orthogonal view) illustrate a $XeF_2$ isotropic etch release of piezoelectric actuator beam 50 and spring assembly 70 from the handle layer (SOI substrate 60). Furthermore, an $O_2$ ash removal of the UV-hardened photoresist 80 occurs. FIGS. 24A and 24B (orthogonal views) and FIG. 25 (cross-sectional and operational view) illustrate the completed device 110.

The embodiments herein utilize the negative deflection attributes of the negative vertical deflection piezoelectric MEMS actuators in conjunction with the positive deflection attributes of the conventional vertical piezoelectric MEMS actuator. In this respect, the embodiments herein may be classified as unimorph bender devices. The central section of a piezoelectric MEMS actuator beam 50 is configured as a positive or negative deflection actuator and the remaining sections of the beam are configured as the opposite deflection actuators. One of these ends is anchored to the substrate 60 and the other is attached to a mechanically compliant spring assembly 70. This spring assembly 70 is configured to possess a large out of plane stiffness and a small lateral (in-plane) stiffness. The actuator 50 has a single set of top 54 and bottom 52 electrodes that supply both the negative and positive deflection regions of the actuator 50 with the same actuation voltage signal. When a voltage is applied between the top 54 and bottom 52 electrodes, the piezoelectric thin film 53 contracts in-plane. Given the piezoelectric moment arms due to the composition of the composite stack 105 within the negative and positive deflection regions, the piezoelectric actuation moments attempt to bend the ends of the beam 50 down while attempting to bend the central section of the beam 50 upward. The actuator beam 50 deflects vertically in the typical manner in which a clamped-clamped beam deforms; however as the right end of the beam is attached to a compliant spring assembly 70, the beam 50 experiences an axial (lateral) displacement. This is due to the preservation of the actuator beam length with the vertical displacement. As the vertical displacement becomes greater, the axial (lateral) displacement also increases. This nonlinear axial displacement provides for lateral piezoelectric MEMS actuation capability.

The compliant spring assembly 70 generally performs multiple tasks. Large spring constants ($K_z/K_x$) of the spring 70 ensures that the end of the actuator 50 that is connected to the spring assembly 70 is confined to uniaxial translational motion. Moreover, large $K_z/K_x$ of the spring 70 ensures the mitigation of residual stress deformation of the piezoelectric actuator beam 50; a common problem with conventional piezoelectric MEMS devices. The springs 70 also provide axial compliance to the actuator 50, thereby enabling large axial (lateral) deflections. The large Kz (out of plane) stiffness of the spring assembly 70 also allows the actuator 50 and spring assembly to support large out of plane external loads. Also, the springs 70 provide mechanical advantage to trade actuation force for displacement, and couple the actuator 50 to the intended mechanism to be acted upon.

The embodiments herein enable large force and/or large lateral deflections for piezoelectric actuators 50 (particularly MEMS), allow for enhanced actuator 50 performance, allow for relaxation of process tolerances for spring features 70, provide orders of magnitude greater blocked force performance per unit area over current piezoelectric lateral actuator configurations. Furthermore, the embodiments herein are minimally sensitive to residual stress deformation of the piezoelectric actuator 50. Moreover, the SOI substrate 60 compatibility of the process allows for the coupling of complex and mechanically robust compliant mechanisms to the high performance actuators 50. Additionally, the embodiments herein enable the integration of large force and/or lateral deflection piezoelectric MEMS actuators, positive and negative vertical piezoelectric MEMS actuators, electro-thermal MEMS devices, and comb-drive electrostatic MEMS devices.

Figure 26:
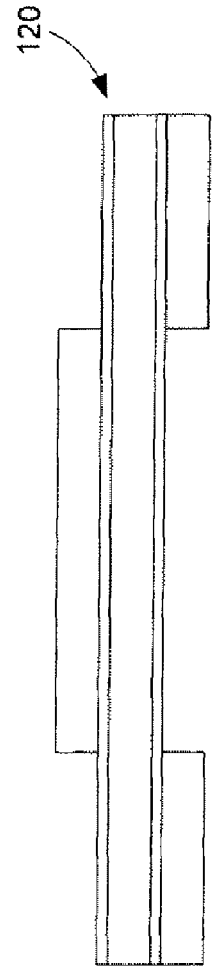
FIG. 26 is a schematic diagram illustrating a cross-sectional view of a macro-scale bulk piezoelectric material device according to an embodiment herein.

Any induced strain actuation mechanism that can be configured in the actuator 50 to mimic the strain response of the piezoelectric device described in embodiments disclosed herein will provide for an effective actuator 50. Using the embodiments herein with bulk piezoelectric material is also possible with compensation for the linear electric field condition. FIG. 26 illustrates a configuration for a macro-scale bulk piezoelectric material device 120 according to an embodiment herein.

While the embodiments herein exploit material property opportunities encountered in the MEMS scale regime; the device 110 is also applicable to other size scales and actuation mechanisms with advantages. Any induced strain actuation mechanism that can be configured in the device 110 to mimic the strain response of the piezoelectric device will provide for an effective actuator 50. The embodiments herein provide an in-plane actuator 50 that obtains large displacements and forces at the low power consumption, and which may be applicable in many military and civilian devices including millimeter scale robotic devices.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A piezoelectric microelectromechanical systems (MEMS) actuator that produces piezoelectric actuation bending moments to generate lateral actuator displacements, said actuator comprising an actuator beam comprising:
   oppositely positioned distal ends;
   a silicon substrate having a first thickness and attached to one of said distal ends;
   a dielectric layer having a second thickness less than said first thickness and positioned above said silicon substrate;
   a first electrode having a third thickness less than said first thickness and positioned above said dielectric layer;
   a piezoelectric layer having a fourth thickness greater than the second and third thicknesses and positioned above said first electrode;
   a second electrode having a fifth thickness substantially equal to or less than said third thickness and positioned above said piezoelectric layer; and
   a conductive structural layer having a sixth thickness greater than said third thickness and positioned above said second electrode,
   wherein a central region of said actuator beam produces a first piezoelectric actuation bending moment in a first direction,
   wherein said distal ends produce a second piezoelectric actuation bending moment equal to said first piezoelectric bending moment and in a second direction equal and opposite to said first direction,
   wherein the first and second piezoelectric actuation bending moments generate lateral displacements of said actuator beam, and wherein said actuator beam comprises positive and negative deflection regions.

2. The actuator of claim 1, further comprising:
a mechanically compliant spring assembly; and
a secondary spring component parallel to a longitudinal axis of said actuator beam, wherein said secondary spring component couples said actuator beam to said mechanically compliant spring assembly, wherein said compliant spring assembly allows for large lateral displacements of said actuator beam and supports vertical loads imposed upon a combination of said actuator beam and said compliant spring assembly,
wherein a first end of said actuator beam is coupled to said silicon substrate, and
wherein said second end of said actuator beam is coupled to said mechanically compliant spring assembly.

3. The actuator of claim 1, further comprising:
a mechanically compliant spring assembly comprising a cantilever spring oriented perpendicular to said actuator beam; and
a secondary spring component parallel to a longitudinal axis of said actuator beam, wherein said secondary spring component couples said actuator beam to said mechanically compliant spring assembly,
wherein a first end of said actuator beam is coupled to said silicon substrate, and
wherein a second end of said actuator beam is coupled to said mechanically compliant spring assembly.

4. The actuator of claim 1, further comprising:
a first curved flexural beam comprising a pair of ends; and
a second curved flexural beam comprising a pair of ends,
wherein said actuator beam is coupled to both ends of each of said first curved flexural beam and said second curved flexural beam, and
wherein one of said first curved flexural beam and said second curved flexural beam is coupled to said silicon substrate at a midpoint of the flexural beam.

5. The actuator of claim 1, further comprising a plurality of actuator beams connected in parallel.

6. The actuator of claim 2, further comprising:
a plurality of actuator beams connected in series; and
a rigid support frame attached to an outer one of said plurality of actuator beams,
wherein a centrally located one of said actuator beams comprises:
a first attachment connecting to a middle of said rigid support frame;
a second attachment to said mechanically compliant spring assembly; and
electrode traces connected to the first and second electrodes.

7. The actuator of claim 1, wherein both said first electrode and said second electrode supply a voltage to both positive and negative deflection regions of said actuator beam.

8. A piezoelectric microelectromechanical systems (MEMS) actuator that produces piezoelectric actuation bending moments to generate lateral actuator displacements, said actuator comprising an actuator beam comprising:
oppositely positioned distal ends;
a silicon substrate having a first thickness and attached to one of said distal ends;
a first dielectric layer having a second thickness less than said first thickness and positioned above said silicon substrate;
a mechanically compliant spring layer having a third thickness less than said first thickness and positioned above said first dielectric layer;
a second dielectric layer having a fourth thickness less than said first thickness and positioned above said mechanically compliant spring layer;
a first electrode having a fifth thickness less than said first thickness and positioned above said second dielectric layer;
a piezoelectric layer having a sixth thickness greater than the fourth and fifth thicknesses and positioned above said first electrode;
a second electrode having a seventh thickness substantially equal to or less than said fifth thickness and positioned above said piezoelectric layer; and
a conductive structural layer having an eighth thickness greater than said fifth thickness and positioned above said second electrode,
wherein a central region of said actuator beam produces a first piezoelectric actuation bending moment in a first direction,
wherein said distal ends produce a second piezoelectric actuation bending moment equal to said first piezoelectric bending moment and in a second direction equal and opposite to said first direction,
wherein the first and second piezoelectric actuation bending moments generate lateral displacements of said actuator beam, and
wherein said actuator beam comprises positive and negative deflection regions.

9. The actuator of claim 8, further comprising a piezoelectric lateral actuator with at least one integrated mechanically compliant spring assembly, wherein the actuator is fabricated by:
forming a passivation layer on the vertical and top sides of said compliant spring layer and the vertical sides of first dielectric layer on said mechanically compliant spring assembly; and
positioning openings in said passivation layer on the vertical surfaces of the longitudinal edges of said actuator beam to allow removal of said compliant spring layer and said silicon substrate beneath said actuator beam.

* * * * *